(12) United States Patent
Delzeit et al.

(10) Patent No.: US 7,473,930 B1
(45) Date of Patent: Jan. 6, 2009

(54) USE OF PATTERNED CNT ARRAYS FOR DISPLAY PURPOSES

(75) Inventors: Lance D. Delzeit, Sunnyvale, CA (US); John F. Schipper, Palo Alto, CA (US)

(73) Assignee: The United States of America as represented by the United States National Aeronautics and Space Administration, Washington, DC (US)

( * ) Notice: Subject to any disclaimer, the term of this patent is extended or adjusted under 35 U.S.C. 154(b) by 480 days.

(21) Appl. No.: 11/173,053

(22) Filed: Jul. 1, 2005

(51) Int. Cl.
*H01L 29/15* (2006.01)
(52) U.S. Cl. .............. 257/77; 257/40; 257/82; 257/E21.128; 257/E21.171; 257/E21.586; 977/939
(58) Field of Classification Search ............ 257/77, 257/82, 40, 401; 438/622; 977/939
See application file for complete search history.

(56) References Cited

U.S. PATENT DOCUMENTS

| | | | |
|---|---|---|---|
| 6,130,143 A * | 10/2000 | Westwater et al. | 438/478 |
| 6,755,530 B1 * | 6/2004 | Loftus et al. | 351/246 |
| 7,288,490 B1 * | 10/2007 | Delzeit | 438/758 |
| 7,327,080 B2 * | 2/2008 | DiSanto et al. | 313/505 |
| 2005/0230270 A1 * | 10/2005 | Ren et al. | 205/777.5 |
| 2006/0025515 A1 * | 2/2006 | Scaringe et al. | 524/496 |
| 2007/0110971 A1 * | 5/2007 | Bonnot | 428/215 |

\* cited by examiner

*Primary Examiner*—Ahmed Sefer
(74) *Attorney, Agent, or Firm*—John F. Schipper; Robert M. Padilla

(57) ABSTRACT

Method and system for providing a dynamically reconfigurable display having nanometer-scale resolution, using a patterned array of multi-wall carbon nanotube (MWCNT) clusters. A diode, phosphor or other light source on each MWCNT cluster is independently activated, and different color light sources (e.g., red, green, blue, grey scale, infrared) can be mixed if desired. Resolution is estimated to be 40-100 nm, and reconfiguration time for each MWCNT cluster is no greater than one microsecond.

12 Claims, 5 Drawing Sheets

USE OF PATTERNED CNT ARRAYS FOR DISPLAY PURPOSES

ORIGIN OF THE INVENTION

This invention was made, in part, by one or more employees of the U.S. government. The U.S. government has the right to make, use and/or sell the invention described herein without payment of compensation therefor, including but not limited to payment of royalties.

FIELD OF THE INVENTION

This invention relates to us of patterned carbon nanotube arrays to produce light of different wavelengths for display purposes.

BACKGROUND OF THE INVENTION

Multi-colored electronic displays that are dynamically reconfigurable require substantial electrical power and are limited in the amount of fine detail provided, by the physical size of the light sources. For example, where phosphor elements are used, as in a television screen or computer monitor, the pixel size is generally no smaller than about 0.1 mm. This limits the resolution available, where much finer work is desired.

What is needed is a multi-color display system that can provide individual pixel contributions as small as 20-40 nm in diameter, that can be dynamically reconfigured in pattern and in color rendition, that has relatively low power consumption, and that can provide a frame rate comparable to that of a conventional television display system.

SUMMARY OF THE INVENTION

These needs are met by the invention, which provides a dynamically reconfigurable, multi-color display system using a grid of optionally patterned carbon nanotube ("CNT") arrays that are connected to a plurality of individually controlled voltage or current sources ("electrical sources"). In a simplest embodiment, a rectangular array of clustered CNTs, preferably multi-wall CNTs ("MWCNTs") is patterned on a substrate, using certain patterning techniques. A rectangular grid of crossed electrical control lines is provided, with each MWCNT cluster ncluding, but not limited to, a single MWCNT) being connected to two or more crossed control lines. Each MWCNT cluster includes one or more of a diode or electroluminescent phosphor (e.g., Cu-activated or Mn-activated ZnS or Ce-activated SrS) or other electrically activatable light source ("EALS"), and each individual electrical line provides no more than about one half the electrical power required to activate an EALS. That is, delivery of power from a single electrical line (only) will not activate the EALS, but delivery of power from at least a threshold number (two or more) of the crossed electrical lines at a single MWCNT cluster will activate the EALS. Optionally, an MWCNT cluster may include first, second and third isolated MWCNTs, each with an EALS that provides a different color (e.g., red, green and blue) when fully activated, and each of the first, second and third MWCNTs is connected to a different pair of crossed electrical lines.

The different crossed pairs of lines can be activated independently to activate the corresponding EALS, analogous to activation of different red, green and blue phosphor dots associated with a television screen or a computer color monitor screen. Alternatively, the EALS can be chosen and configured to provide a spectrum of grey scale light sources with N different basic grey scale values so that up to $2^N$ black, white and intermediate grey scale hues can be generated at a single cluster.

DESCRIPTION OF BEST MODES OF THE INVENTION

Figure 1:
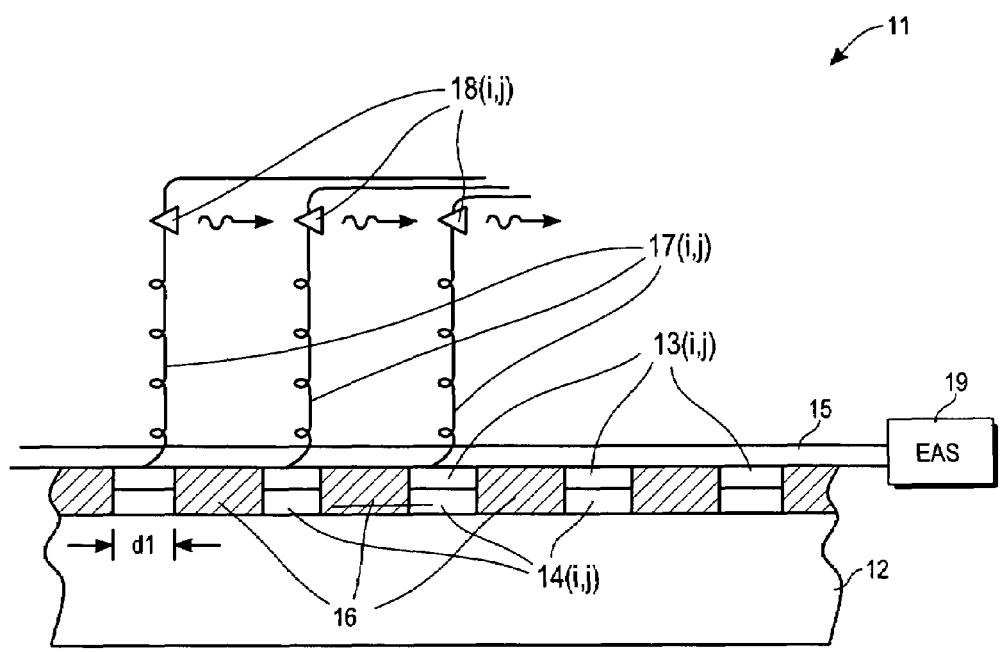
FIGS. 1, 2 and 4 a cross sectional side view, a top view and a top view illustrating an embodiment of the invention.
Figure 2:
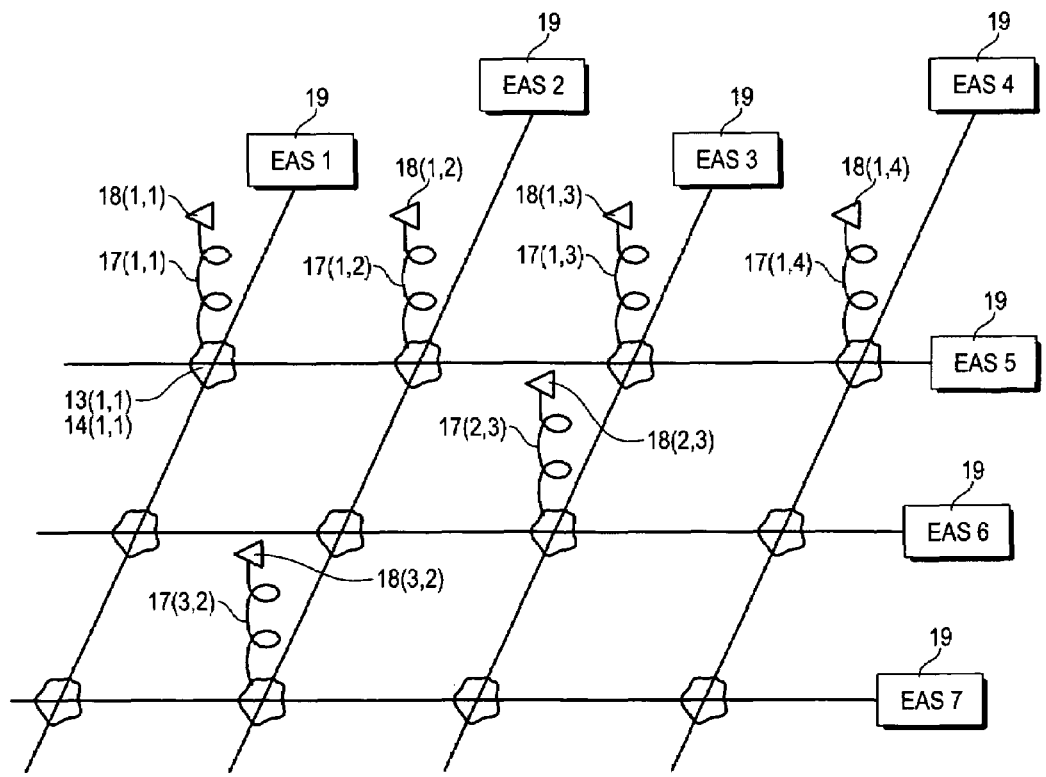

FIGS. 1 and 2 are a cross sectional side view and a top view illustrating an embodiment of the invention. The system 11 includes: a substrate 12 (optional); a patterned sequence of catalyst layers, 13($i,j$); a patterned sequence of catalyst underlayers 14($i,j$); a grid (rectangular or polygonal or other) 15 of crossed electrical lines, where two crossed lines intersect at one of the catalyst underlayers 14($i0,j0$); a plurality 16 of electrically insulating patches, each patch being located between adjacent crossed electrical lines; a sequence of MWCNT clusters 17($i,j$), where each MWCNT cluster 17($i0,j0$) is grown on a corresponding catalyst underlayer 14($i0,j0$) and is connected to an EALS 18($i0,j0$) to provide light having a selected wavelength $\lambda(i0,j0)$, or a selected range of wavelengths. Each electrical line in the grid 15 is independently electrically activated by one of a plurality of electrical activation sources 19.

Figure 3:
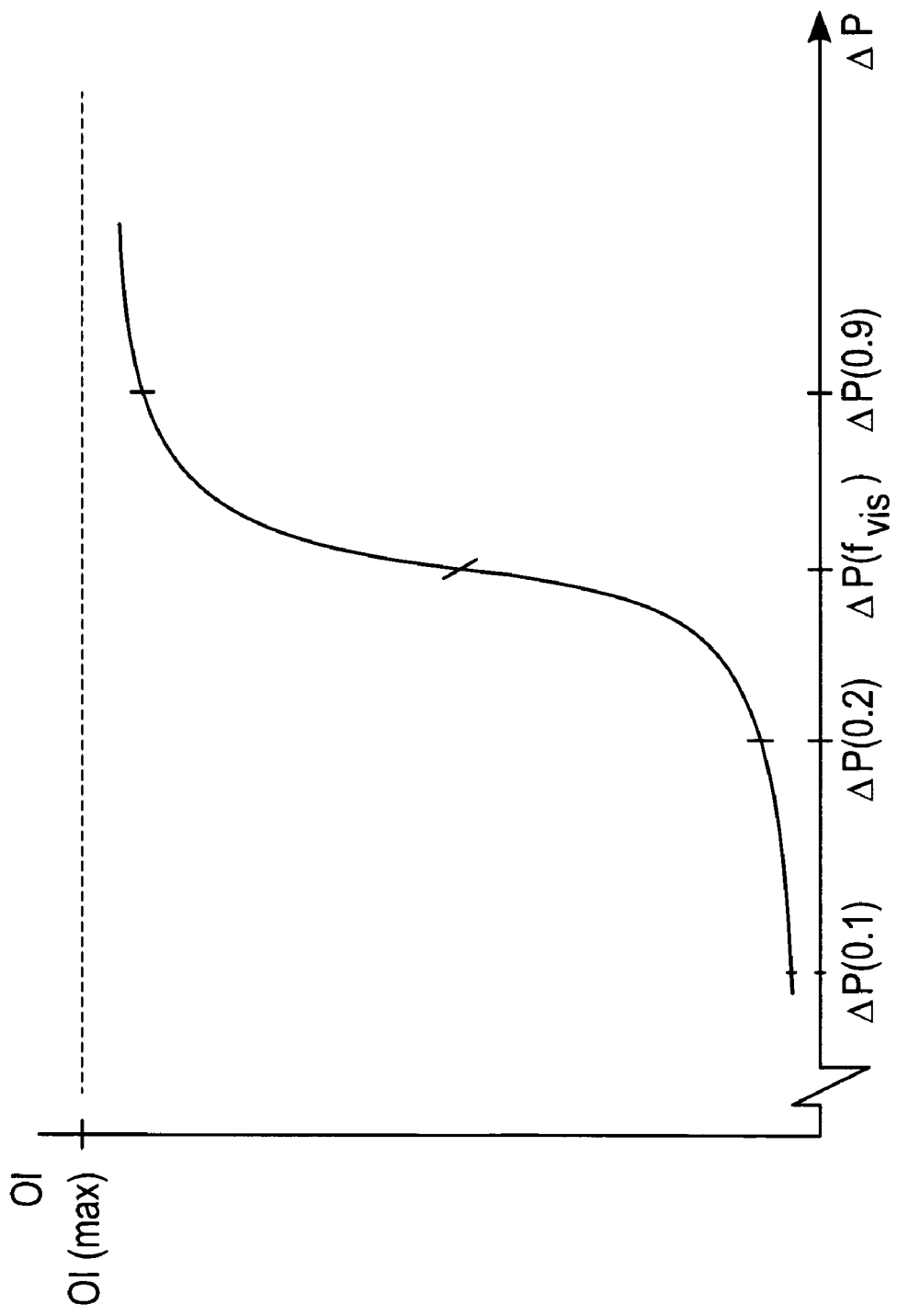
FIG. 3 graphically illustrates variation of fractional device activation with variation of electrical current or voltage difference for a selected light source.

When each of two crossed electrical lines in the grid 15 is activated by the appropriate sources 19, each line contributes a selected current increment $\Delta I$ or a selected voltage increment $\Delta V$ (referred to collectively herein as a "power increment $\Delta P$") to the corresponding MWCNT cluster 17($i0,j0$), and each of these increments is received the corresponding EALS 18($i0,j0$). FIG. 3 schematically illustrates variation of output intensity OI from a representative diode with variation of the power increment $\Delta P$, a typical S-shape curve with power increment values $\Delta P(f)$ corresponding to selected fractions $f=0.1, 0.2, \ldots, 0.9$ at which the power output is approximately $f$ times the maximum output intensity OI(max). Below a certain power output, approximately $f_{vis}$OI(max), corresponding to $\Delta P=\Delta P(f_{vis})$, the human eye is unlikely to perceive light having a given color. Where a power increment, $\Delta P(f)=\Delta P(Xf_{vis})$ is present, corresponding to only one activated electrical line, and $0.5<X<<1$, presence of only this power increment will not produce a visually perceptible signal having a clearly discernible color. However, where a power increment from each of two crossed electrical lines is present, the total power increment, $\Delta P(f)=\Delta P(2Xf_{vis}s)$, will produce an output intensity OI corresponding to a visually perceptible signal having a clearly discernible color.

Thus, activation of an electrical source 19 for each of these two crossed electrical lines will produce light having a discernible color at the MWCNT cluster location 17($i0,j0$) and will not, by itself, produce light having a discernible color at any other MWCNT cluster. An electrical signal carried by an electrical line 15 will be received by all MWCNT clusters to which that line is connected through the catalyst underlayer 14($i,j$); but this signal will be electrically insulated from direct interaction with the catalyst by interposition of one or more of the plurality of insulating patches 16.

In the crossed line configuration shown in FIG. 3, each MWCNT, or each CNT-unit, is preferably activated during a separate time interval (e.g., having a length in a range $10^{-9}$-$10^{-6}$ sec). Alternatively, two or more MWCNTs or CNT-units, with locations corresponding to selected crossed electrical lines, are activated during substantially the same time interval(s). Where electroluminescent phosphor elements are used as the EALSs 18(i,j), the EALSs can be activated sequentially (for example, one-by-one or two-by-two) in a manner analogous to sequential activation of phosphor elements in a television screen or computer monitor screen. Each activated phosphor element remains "lit" for a selected time interval (e.g., 0.01-0.03 sec) so that the image displayed persists in the observer's eye for a sufficient time to appear to provide a total image.

Figure 4:
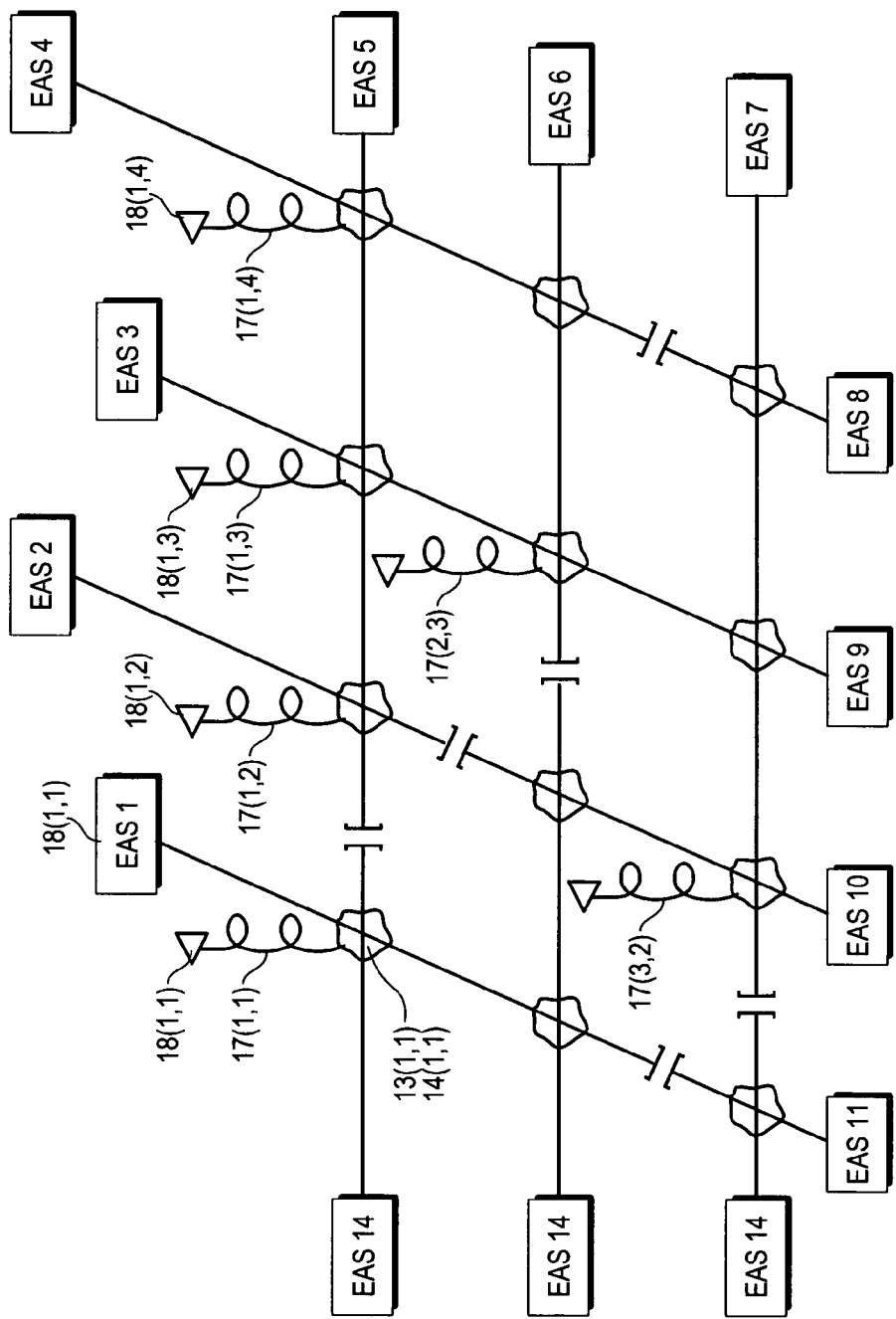

In an alternative approach, the electrical lines shown in FIGS. 1 and 2 can be broken into shorter segments, with each segment having its own controllable electrical activation source ("EAS"), as illustrated in FIG. 4. With this approach, the overall display can be decomposed into a plurality of sub-displays, for greater flexibility in forming display images and for an increase in rate of change of the image(s) shown on a display "frame," by analogy with change of a frame (one or two fields) on a television screen.

Figure 5A:
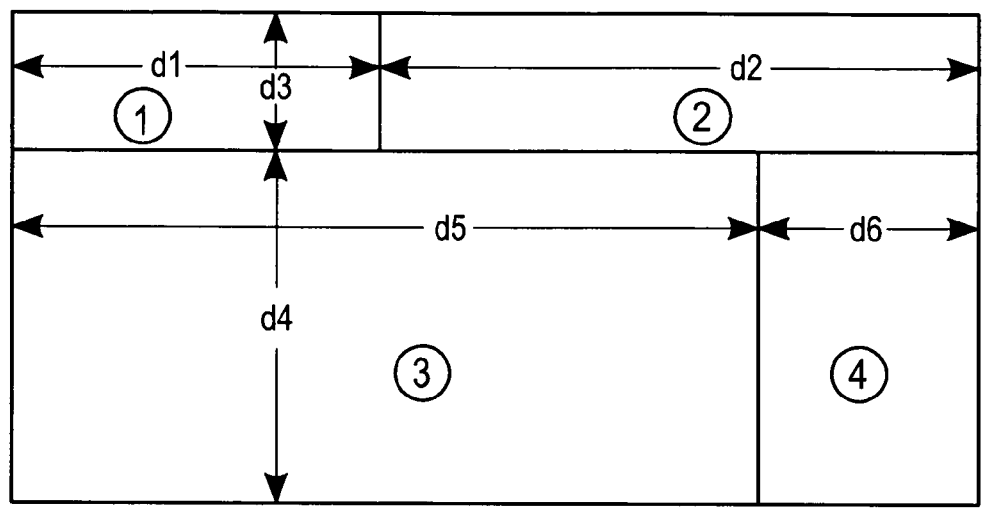
FIGS. 5A-5C illustrate selective light source activation according to the invention.
Figure 5B:
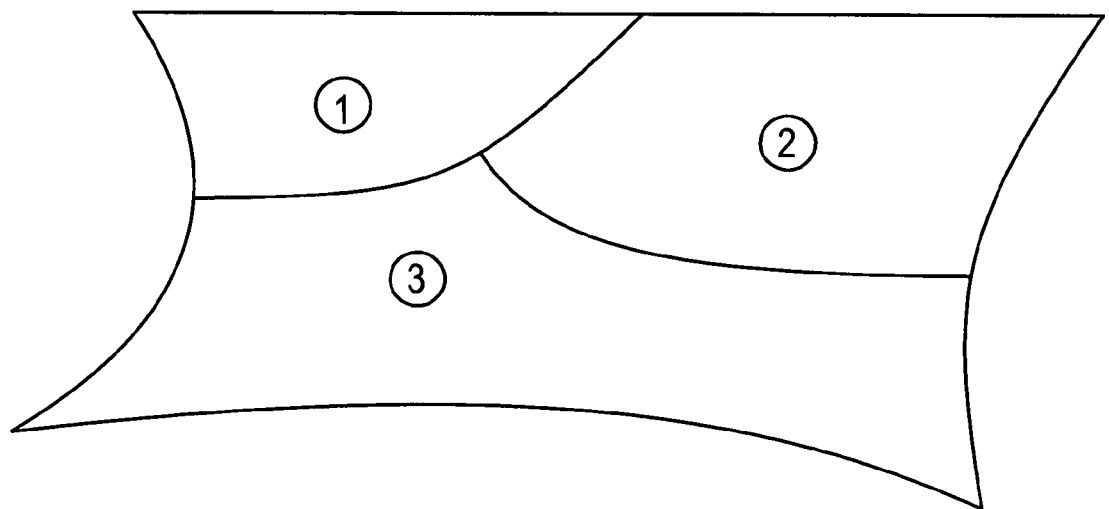
Figure 5C:
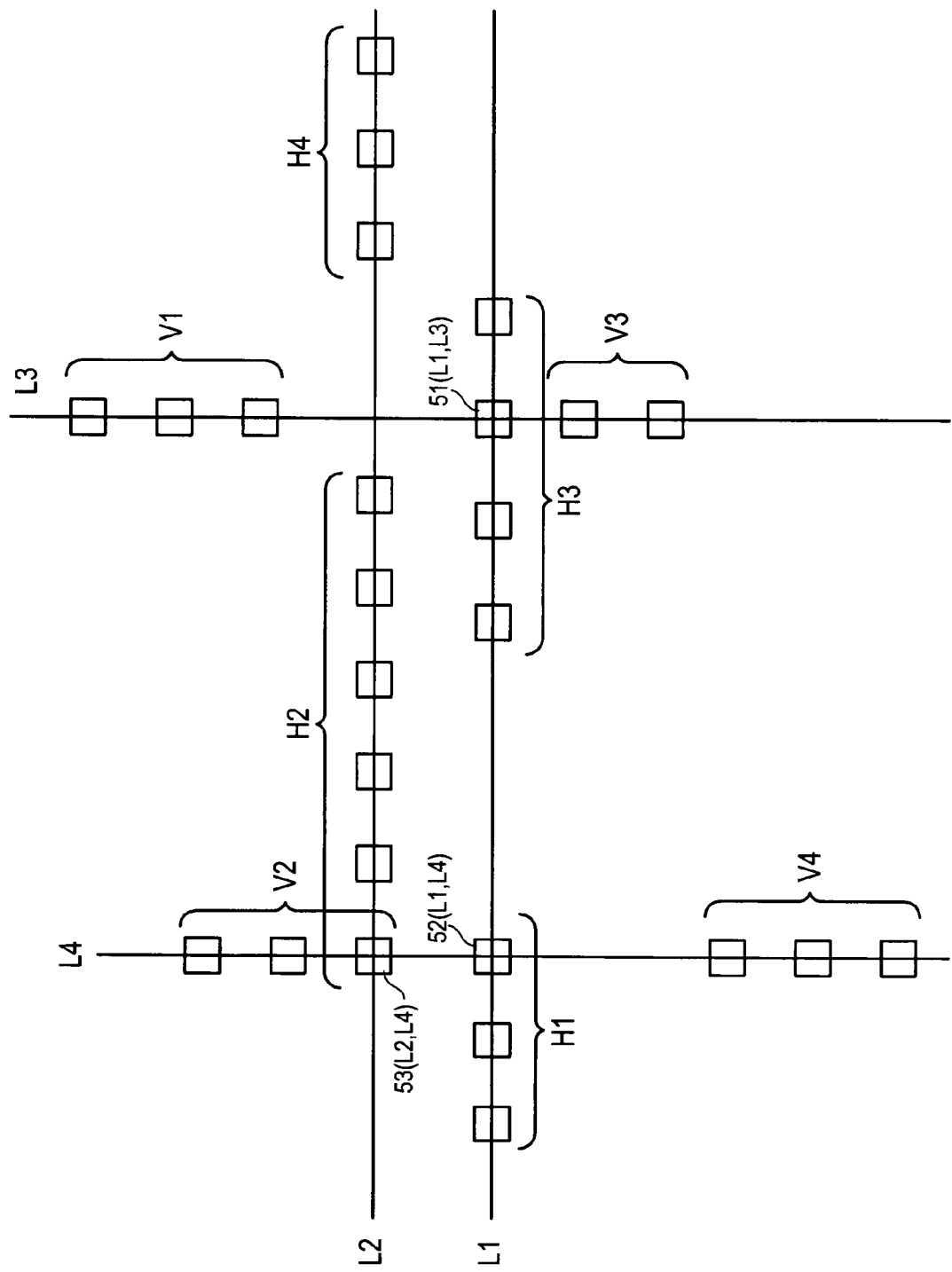

FIGS. 5A-5C illustrate some suitable configurations for providing electrical line segments that define selected activation sub-regions within the overall display region. In FIG. 5A, the sub-regions 1, 2, 3 and 4 are four rectangular areas having dimensions d1×d3, d2×d3, d5×d4 and d6×d4, where d1 and d2 may be substantially the same or be substantially different, d3 and d4 may be substantially the same or be substantially different, and d5 and d6 may be substantially the same or be substantially different. CNT-units can be activated independently in each of these four sub-regions, because the electrical lines have no overlap; the segments are broken (open circuit), or are not connected to each other.

In FIG. 5B, one or more of the sub-regions is defined by curvilinear boundaries, chosen to correspond to the symbol(s) or image(s) to be selectively displayed in that sub-region. Again, the MWCNTs or CNT-units within one sub-region can be activated independently of the MWCNTs or CNT-units in a second sub-region.

In FIG. 5C, parallel electrical lines are offset in groups of one or more lines from each other so that a first electrical line L1 may contact a first MWCNT group H1, avoid contact with a second MWCNT group H2, contact a third MWCNT group H3, avoid contact with a fourth MWCNT group H4, and so on until this line terminates. A second electrical line L2 avoids contact with the group H1, contacts the second group H2, avoids contact with the third group H3, contacts the fourth group H4, and so on until this line terminates.

A third electrical line L3 crosses the lines L1 and L2, contacts a fifth MWCNT group H1, avoids contact with a sixth MWCNT group H2, contacts a seventh MWCNT group H3, avoids contact with an eighth MWCNT group H4, and so on until this line terminates. A fourth line L4 crosses the lines L1 and L2, avoids contact with the fifth group H1, contacts the sixth group H2, avoids contact with the seventh group H3, contacts the eighth group H4, and so on until this line terminates.

The lines L1 and L3 intersect at one or more MWCNTs 51(L1,L3). The lines L1 and L4 intersect at one or more MWCNTs 52(L1,L4). The lines L2 and L3 do not intersect at one or more MWCNTs. The lines L2 and L4 intersect at one or more MWCNTs 53(L2,L4). Thus, one or more MWCNTs is not necessarily located at an intersection of two or more lines in the illustration in FIG. 5C. The MWCNT(s) (and corresponding EALS) located at the intersection of the lines L1 and L may be selectively activated, and thus "lit," by activating the electrical lines L1 and L4.

The number of SWCNTs or MWCNTs that may be grown on a 20 nm×20 nm region on a catalyst layer has been estimated to be 1-4 in U.S. Pat. No. 6,858,197. Assuming, conservatively, that a single MWCNT is grown on such a region and that adjacent growth regions are also separated by about 20 nm, the number of light sources 19 that can be positioned on a 1 cm×1 cm macro-region is estimated to be about $2.5\times10^5$ in each of two substantially orthogonal directions, which is more than 3 orders of magnitude larger than an estimated number of conventional pixels, 40-120 per cm in any given direction, for a television screen or computer monitor screen. If three adjacent light sources (e.g., red, green and blue) are treated as a unit light source, the number of these light source units 19 is reduced to about $8\times10^4$ in a given direction, and this number of these light source units is still 2-3 orders of magnitude larger than the number of conventional pixels illuminated on a television screen or computer monitor screen.

Electrical power consumed for a display screen of size 40 cm×25 cm, based upon the invention, will depend upon the MWCNT density used. Assuming, for purposes of comparison, a density of 300×300 MWCNTs per "square" (1 cm$^2$), an electrical resistance of 30 Ohm per MWCNT, a required current of 0.1 micro-Amp per MWCNT, and an activation of one-half of the light sources units, the power required is estimated to be $2.7\times10^{-8}$ Watts/square, or $2.7\times10^{-3}$ Watts/screen. If a MWCNT-electrical line connection has an average resistance of, say, R Ohms, this condition will increase the estimated power consumption by a factor of 1+(R/30), which is unlikely to larger than about 10.

The CNT-units may individually include one, two, three or more EALSs with one, two, three or more distinguishable colors, such as red, green and blue, so that substantially all colors in the visible spectrum can be generated. As a first alternative, part or all of the (activated) CNT-units may generate $2^p$ grey scale "colors," with $p \geq 1$ so that part or all of the image screen can be used to display grey scale images. As a second alternative, part or all of the (activated) CNT-units may generate an image with wavelengths in the infrared portion of the spectrum, where this image is viewed and/or interpreted by an electronic device that senses and distinguishes between different infrared wavelengths.

What is claimed is:

1. A reconfigurable display system comprising:
   at least first, second and third spaced apart under-layers, deposited on a surface of a substrate, each under-layer having a selected thickness and including at least one of Al and Ir, where the under-layers form a selected pattern;
   at least first, second and third spaced apart catalyst layers, deposited on the at least first, second and third under-layers, respectively, each catalyst layer having a selected thickness and including at least one of Fe, Ni, Co, Mo and Ti;
   an electrically insulating layer, deposited in an interstitial region between each pair of the at least first, second and third catalyst layers or between each pair of the at least first, second and third under-layers;
   at least first, second and third clusters of one or more multi-wall carbon nanotubes ("MWCNTs") grown on the at least first, second and third catalyst layers, respectively, where each MWCNT has a light emitting component connected thereto that is spaced apart from the at least first, second and third catalyst layers; and
   at least first and second transversely oriented electrical lines, connecting the first and second MWCNT clusters, and connecting the second and third MWCNT clusters, respectively, with the first and second electrical lines being connected to first and second activatable electrical signal sources, respectively, of at least one of ) an electrical current having a selected current value and i) a voltage difference having a selected voltage difference value, where provision of an electrical signal from the first electrical signal source alone, or from the second electrical signal source alone, is insufficient to fully activate the light emitting component connected to the second MWCNT cluster, and where provision of electrical signals from the first and second electrical signal sources at the same time is sufficient to fully activate the light emitting component connected to the second MWCNT cluster.

2. The system of claim 1, wherein said pattern of said under-layers includes a substantially rectangular pattern.

3. The system of claim 1, wherein said pattern of said under-layers includes at least one curvilinear boundary segment.

4. The system of claim 1, further comprising a third electrical line, spaced apart from and substantially parallel to said first electrical line, where the third electrical line is connected to said third cluster of said MWCNTs, where at least one of said MWCNTs in said third cluster is not included in said first cluster and at least one of said MWCNTs in said first cluster is not included in said third cluster.

5. The system of claim 1, wherein at least one of said light emitting components is a light emitting diode having a selected wavelength range.

6. The system of claim 5, wherein said selected wavelength range includes at least one of a red color, a green color and a blue color from a visible spectrum.

7. The system of claim 5, wherein said selected wavelength range includes at least one grey scale tone.

8. The system of claim 5, wherein said selected wavelength range includes at least one wavelength in an infrared range.

9. The system of claim 1, wherein at least one of said light emitting components is a light emitting phosphor having a selected wavelength range.

10. The system of claim 9, wherein said selected wavelength range includes at least one of a red color, a green color and a blue color from a visible spectrum.

11. The system of claim 9, wherein said selected wavelength range includes at least one grey scale tone.

12. The system of claim 9, wherein said selected wavelength range includes at least one wavelength in an infrared range.

* * * * *